(12) United States Patent
Sieh

(10) Patent No.: US 8,219,051 B2
(45) Date of Patent: Jul. 10, 2012

(54) FRONT-END RECEIVER CIRCUIT WITH MULTIPLE PATHS WHICH ARE SIMULTANEOUSLY ACTIVE AND RECEIVER SYSTEM USING THE SAME

(75) Inventor: Dai Sieh, Palo Alto, CA (US)

(73) Assignee: Mediatek Inc., Hsin-Chu (TW)

( * ) Notice: Subject to any disclaimer, the term of this patent is extended or adjusted under 35 U.S.C. 154(b) by 210 days.

(21) Appl. No.: 12/816,038

(22) Filed: Jun. 15, 2010

(65) Prior Publication Data

US 2011/0237213 A1 Sep. 29, 2011

Related U.S. Application Data

(60) Provisional application No. 61/317,706, filed on Mar. 26, 2010.

(51) Int. Cl.
*H04B 17/02* (2006.01)

(52) U.S. Cl. ..... 455/134; 455/132; 455/133; 455/552.1; 455/76; 455/574; 370/276

(58) Field of Classification Search .................. 455/134, 455/132, 133, 552.1, 76, 574; 370/276
See application file for complete search history.

(56) References Cited

U.S. PATENT DOCUMENTS

| 6,987,957 | B2* | 1/2006 | Suzuki et al. | 455/147 |
|---|---|---|---|---|
| 7,636,554 | B2* | 12/2009 | Sugar et al. | 455/73 |
| 2003/0207668 | A1* | 11/2003 | McFarland et al. | 455/3.01 |
| 2004/0219959 | A1* | 11/2004 | Khayrallah et al. | 455/575.7 |

* cited by examiner

*Primary Examiner* — Sanh Phu
(74) *Attorney, Agent, or Firm* — Sawyer Law Group, P.C.

(57) ABSTRACT

A front end receiver is disclosed. The front end receiver comprises a plurality of transmissive signal paths originating from one signal input, a plurality of switching mechanisms; and at least one path of the plurality of transmissive signal paths including a first amplifier coupled to a first input port of each of the plurality of switching mechanisms. The front end receiver also comprises at least another path of the plurality of transmissive signal paths including a second amplifier coupled to a second input port of each of the plurality of switching mechanisms. The receiving subsystem coupled to the output port of each switching mechanism. Each of the receiving subsystems controls a switching mechanism to select the path that is optimal for radio reception depending on the strength of signal being received.

21 Claims, 5 Drawing Sheets

PRIOR ART OF A DUAL-RECEIVER

FRONT-END RECEIVER CIRCUIT WITH MULTIPLE PATHS WHICH ARE SIMULTANEOUSLY ACTIVE AND RECEIVER SYSTEM USING THE SAME

CROSS-REFERENCE TO RELATED APPLICATIONS

This application claims benefit under 35 USC 119(e) of Provisional Application Ser. No. 61/317,706, filed on Mar. 26, 2010.

FIELD OF THE INVENTION

The present invention relates to a front-end circuit and more particularly, to a front-end circuit with two or more signal paths.

BACKGROUND

Many types of devices are used in wireless applications. For example, cell phones, laptops, mobile devices, smart phones and the like are devices that communicate wirelessly and utilize wireless application for different types of communications. Oftentimes these devices include multiple receivers for different communication functions. In a wireless device in which multiple receivers share the same radio frequency input, such as the case where an antenna and its associated filters and/or switches are shared by a plurality of receivers, oftentimes the different receivers are for different types of communication systems such as Wi-Fi, Bluetooth, GPS and the like.

FIG. 1 illustrates a block diagram of a conventional dual receiver 10. The dual receiver 10 includes a receiver front end 18 coupled to a plurality (in this case two) of receiver subsystems 20. The receiver front end 18 comprises an antenna 12 and programmable amplifier 14. The programmable amplifier 14 can be adjusted to provide variable gain amplification to the signal received by the antenna. Each of the receiver subsystems 20 include a mixer 22a, 22b coupled to an amplifier 24a, 24b which in turn provides an output signal 26a, 26b.

In order to achieve an optimal receiving performance, such as sensitivity, the plurality of receiver subsystems 20 are usually connected together after a pre-amplifier 14 to minimize the degradation to the overall system sensitivity due to the signal splitting power loss. Each of the receiver subsystems 20 usually needs a different amount of pre-amplifier 14 gains because the strengths of the signals each receiver subsystem 20 intends to receive (usually at different frequencies) can be different. Therefore, it is desirable for the common front-end circuit 18 to be able to provide different amounts of amplifications for each of the receivers simultaneously which the conventional dual receiver 10 can not achieve.

A conventional method to optimize the dual receiving performance is by over-designing each of the plurality of receivers such that each of the plurality of receiver subsystems 20 can tolerate the maximum possible incoming signal power with a fixed pre-amplifier gain that is common to both receivers.

Another conventional method is to adjust the front-end gain for optimal reception of the large input signal of one selected receiver. The performance of the other one of the two receivers is usually degraded when the selected pre-amplifier is too high or two low for the non-preferred receiver.

A third conventional method is by timesharing the operation of the two receivers so that each of the two receivers can set an optimal front-end gain when it is active. The problem with this method is that it does not allow for use of the plurality of receiver subsystems at the same time.

Accordingly, there is a need for an efficient and cost effective way for the plurality of receiver subsystems in a wireless device to operate at their respective optimal settings to achieve maximum dynamic range. The present invention addresses such a need.

SUMMARY OF THE INVENTION

A front end receiver is disclosed. The front end receiver comprises a plurality of transmissive signal paths originating from one signal input; a plurality of switching mechanisms, each switching mechanism switches one output port to one of many input ports; and at least one path of the plurality of transmissive signal paths including a first amplifier coupled to a first input port of each of the plurality of switching mechanisms. The front end receiver also includes at least another path of the plurality of transmissive signal paths including a second amplifier coupled to a second input port of each of the plurality of switching mechanisms. Each receiving subsystem is coupled to the output port of each switching mechanism. Each of the receiving subsystems controls a switching mechanism to select the path that is optimal for radio reception depending on the strength of the signal being received.

BRIEF DESCRIPTION OF THE DRAWINGS

The accompanying drawings illustrate several embodiments of the invention and, together with the description, serve to explain the principles of the invention. One skilled in the art will recognize that the particular embodiments illustrated in the drawings are merely exemplary, and are not intended to limit the scope of the present invention.

DETAILED DESCRIPTION OF PREFERRED EMBODIMENTS

The present invention relates to a front-end circuit and more particularly, to a front-end circuit with dual gain. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention presents a front-end circuit such that the two or more receivers can operate at their respective optimal settings to achieve maximum dynamic range.

It is therefore an object of the present invention to provide a front-end circuit such that the maximum signal power delivered to each of the receivers is conditioned to be within a correct range.

It is therefore another object of the present invention to provide a front-end circuit that has two signal paths. Each of the two receivers selects a path that is optimal for the strength of the signal the receiver intends to process. In other words, at least two receivers share the same front-end (pre-amplifier) but can individually select the gain of the pre-amplification that is optimal to satisfy the dynamic range limitation of each individual receiver.

Figure 1:
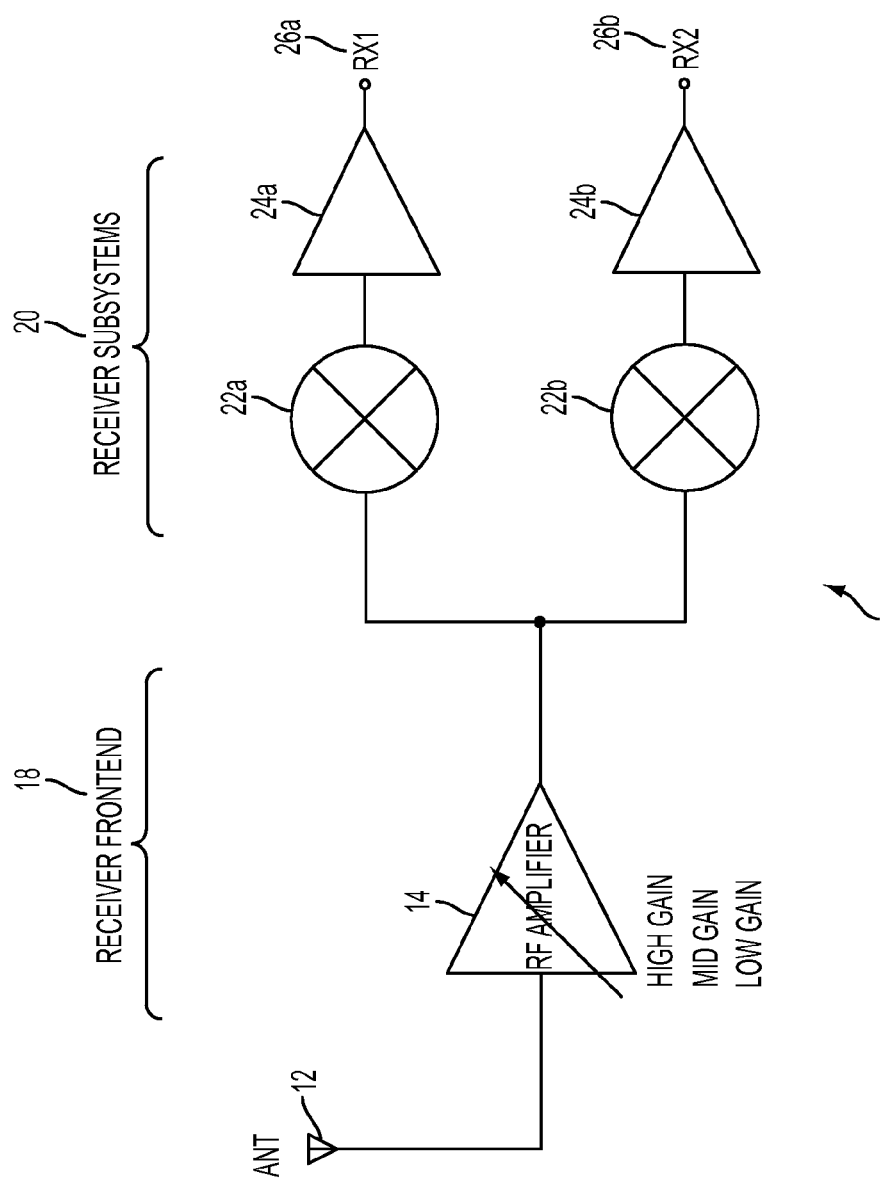
FIG. 1 illustrates a block diagram of a conventional dual receiver.
Figure 2:
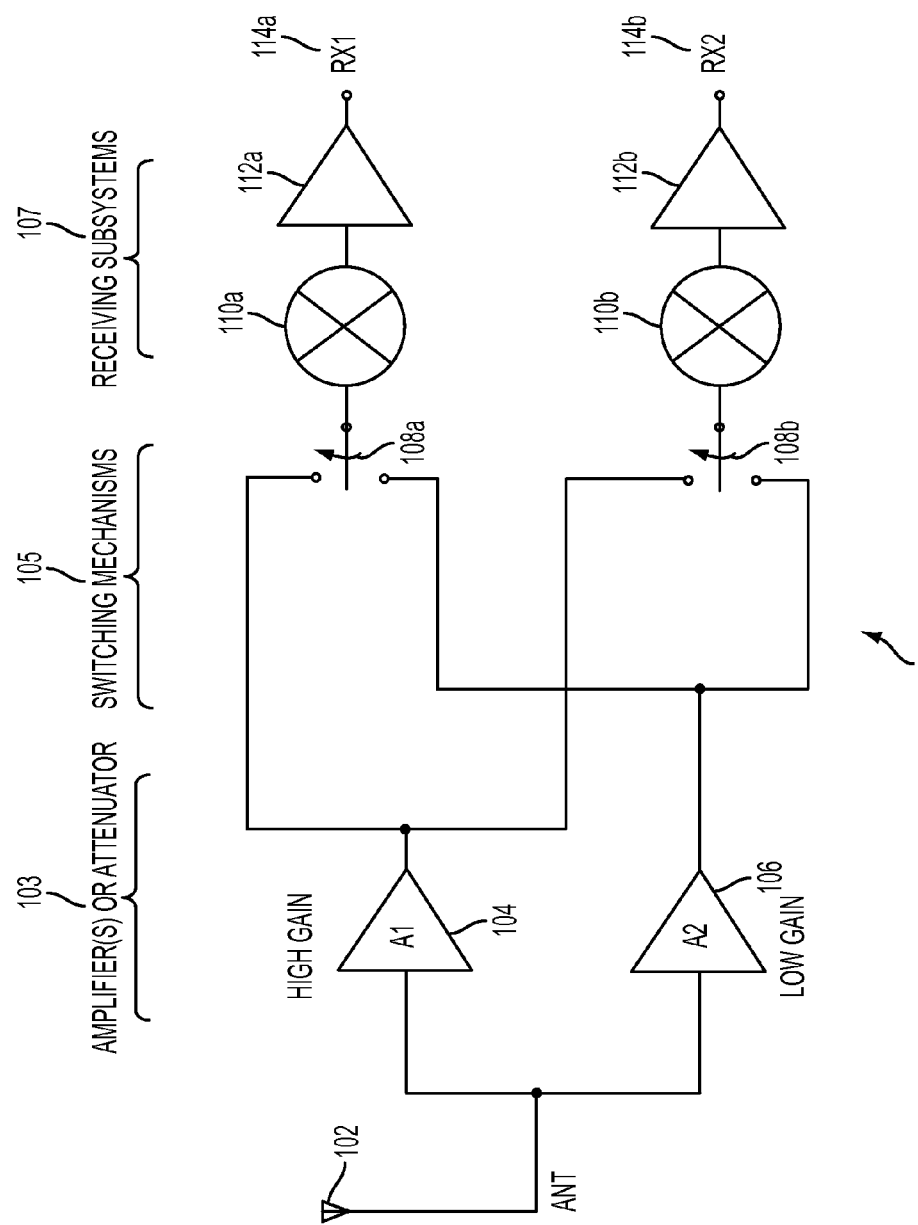
FIG. 2 shows a first embodiment of a front-end architecture according to the present invention.

FIG. 2 shows a first embodiment of a front-end architecture 100 according to the present invention. The input to the front-end is labeled "ANT" 102, which may be an antenna. The architecture 100 includes an amplifier section 103 which includes amplifier 104 and amplifier 106 coupled to the antenna 102. The architecture also includes a switching mechanisms section 105 which include two switching mechanisms 108a and 108b. The architecture 100 includes a receiving subsystems section 107. The receiving subsystems section includes, in this embodiment, two receiving subsystems each of which includes a mixer 110a-110b coupled to amplifiers 112a-112b. The outputs of the receiver subsystems are respectively labeled as "RX1" 114a and "RX2" 114b.

It should be understood by one of ordinary skill in the art that a system and method in accordance with the present invention is not limited to the two receivers illustrated in FIG. 2. The present invention can be applied to any wireless system that utilizes more than one receiver subsystem and that use would be within the spirit and scope of the present invention.

In an embodiment, amplifier 104 has a higher gain than amplifier 106. Also amplifiers 104 and 106 may be active simultaneously.

Figure 5:
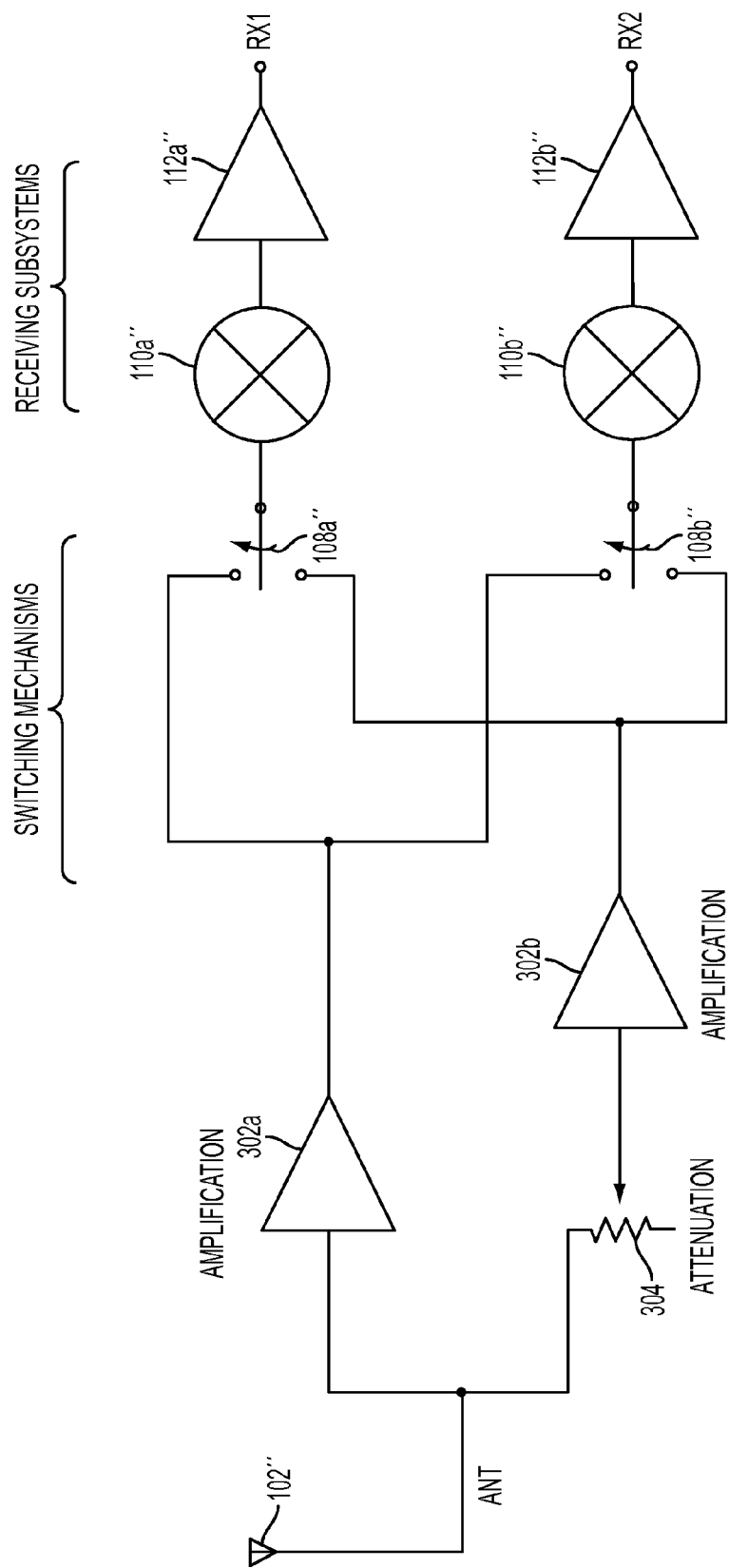
FIG. 5 illustrates a block diagram of a third embodiment of a front end architecture in accordance with the present invention.

The low gain amplifier 106 has a high input impedance. Therefore, when the two front-end paths, 104 and 106, are combined at the input 102, there is [a] negligible reduction to the input signal power for the high gain amplifier 104. This is an important feature in a system and method in accordance with the present invention. Because of the low gain nature of amplifier 106, it is very easy to achieve a high input impedance by one of ordinary skill in the art. The attenuator 304 in FIG. 5 is one such example. Each of the two receivers, 110a-110b switches between the outputs for the amplifiers 104 and 106 to allow the received signals to be maintained within their dynamic ranges.

The structure may comprise two buffer amplifiers whose outputs are connected to the inputs of the following receiving stages by combiners or switching mechanisms. However, any other applicable switches can be used herein. The amplifiers 104 and 106 are optimally designed for fixed amplification gains.

Using the front-end structure described above, multiple receiver subsystems which receive signals from one common input port 102 can select different amounts of amplification in the pre-amplifier stage to condition the input signal delivered to each individual receiver subsystem to be within the dynamic range of that particular receiver.

Figure 3:
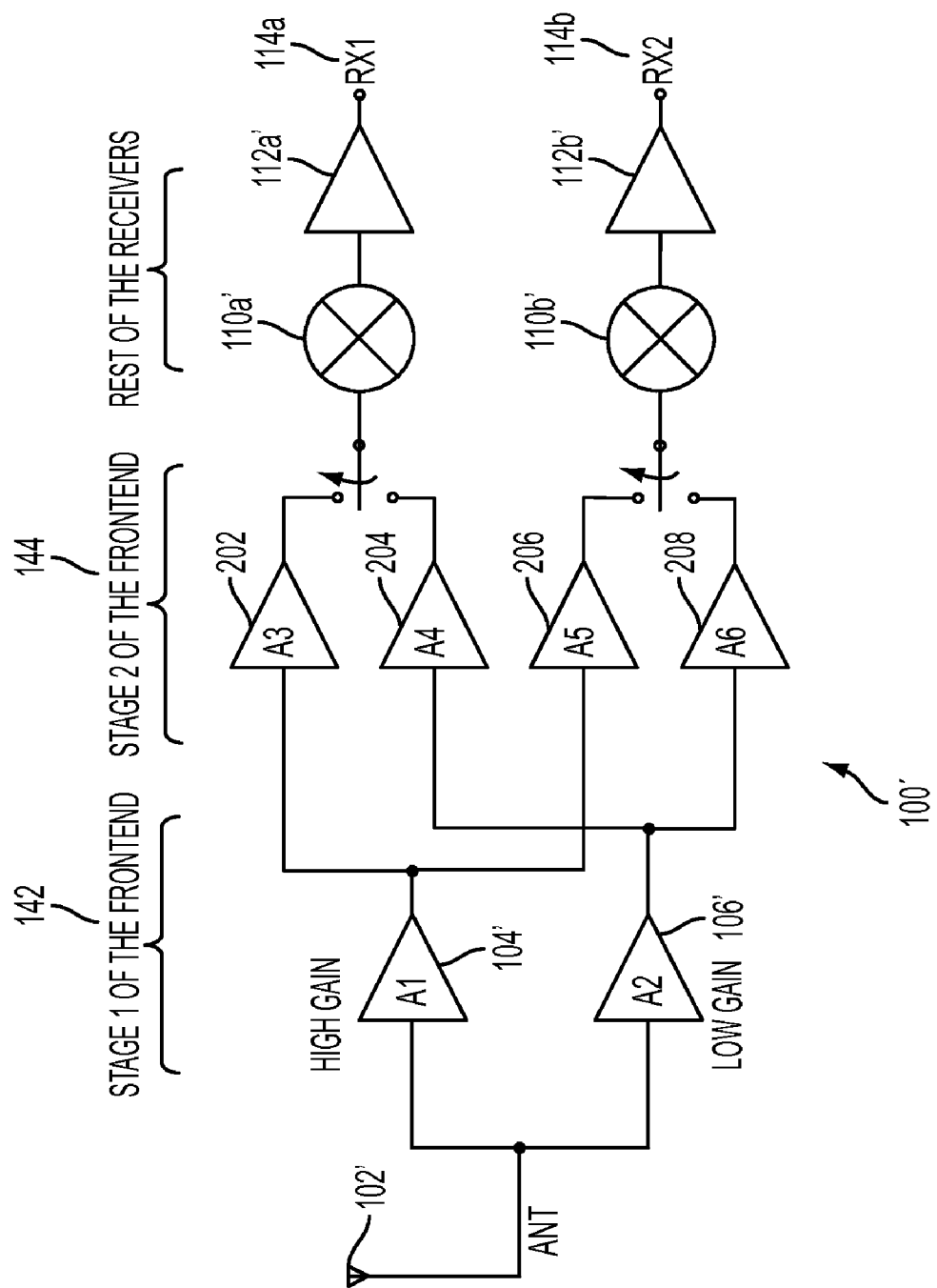
FIG. 3 illustrates a block diagram of a second embodiment of a front end architecture in accordance with the present invention.

FIG. 3 illustrates a block diagram of a second embodiment of a front end architecture 100' in accordance with the present invention. Front end architecture 100' has similar elements to those described in the architecture of FIG. 2 and those elements have similar designators. However the architecture 100' includes at stage 2 144 of the architecture 100' a plurality of amplifiers 202-208 coupled to the amplifier 104' and 106'. In this embodiment amplifiers 202 and 206 are coupled to the amplifier 104' and amplifiers 204 and 208 are coupled to amplifier 106'. The structure of the stage 2 144 outputs are connected to the inputs of the following receiving stages.

Optionally, the stage 2 amplifiers, "A3" thru "A6", 202, 204, 206 and 208, can have adjustable gain to provide an additional RF AGC function that conditions the input powers to their respective following stages (usually down-conversion mixers 110a' and 110b').

Using the front-end structure described above, multiple receivers 112a' and 112b' which receive signals from one common input port 102' can select different amounts of amplification in the pre-amplifier stage to condition the input signal delivered to each individual receiver 114a'-114b' to be within the dynamic range of that particular receiver.

Figure 4:
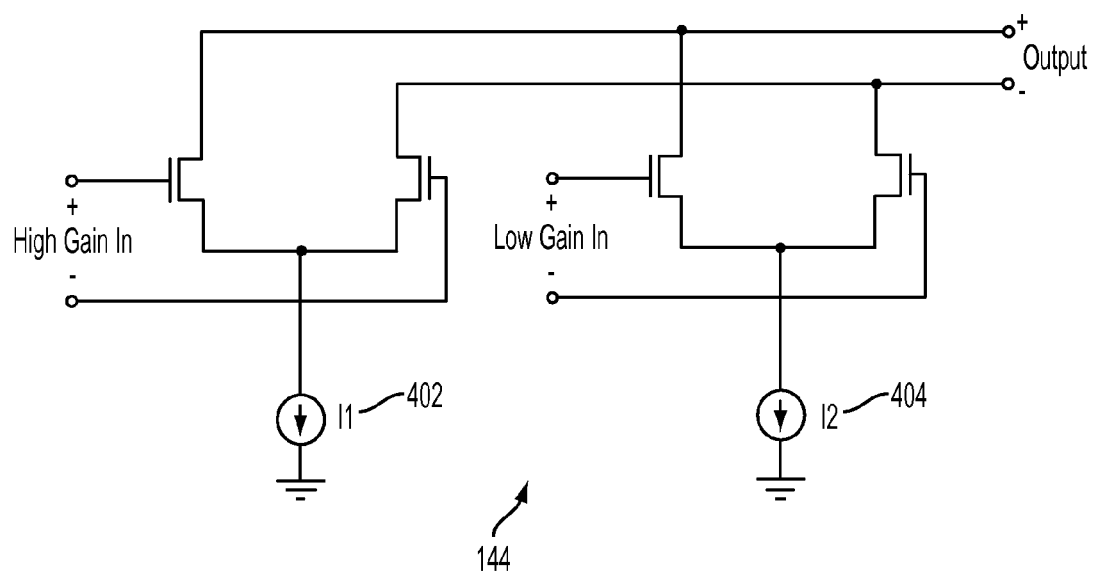
FIG. 4 illustrates one example of a realization of the stage 2 switching function of FIG. 3.

FIG. 4 illustrates the operation of the stage 2 144 switching function of FIG. 3. In this embodiment, the terminals of "High Gain In" connect to the output of the high gain amplifier 104' while the terminals of "Low Gain In" connect to the output of the low gain amplifier 106". The bias current sources "I1" 402 and "I2" 404 are turned on alternatively to select the high gain path versus the low gain path to implement the switching function.

FIG. 5 illustrates a block diagram of a third embodiment of a front end architecture 100" in accordance with the present invention. Front end architecture 100" has similar elements to those described in the architecture of Figure and those elements have similar designators. The key difference is that in this embodiment the amplifiers 302a and 302b are identical; however, the input to amplifier 302b is attenuated by attenuator 306 at its input. This allows for the reduction of the gain of the amplifier 302b and increases the high signal tolerance of the amplifier 302b.

According to another embodiment of the present invention, a receiver with the aforementioned front-end circuit is also provided. A system and method in accordance with the present invention provides a radio communications receiver such that a plurality of receivers can operate at their respective optimal settings to achieve maximum dynamic range. The system and method provides for a front-end circuit such that the maximum signal power delivered to each of the receivers is conditioned to be within a correct range. A front end circuit is provided that allows for a plurality of transmissive signal paths to be provided simultaneously.

Furthermore each of the receivers can select a path that is optimal for the strength of the signal the receiver intends to process. In other words, at least two receivers share the same front-end (pre-amplifier) but can individually select the gain of the pre-amplification that is optimal to satisfy the dynamic range limitation of each individual receiver.

Although the present invention has been described in accordance with the embodiments shown, one of ordinary skill in the art will readily recognize that there could be variations to the embodiments and those variations would be within the spirit and scope of the present invention. A system and method in accordance with the present invention can be utilized in a variety of environments that utilizes a plurality of communication receivers in a system with a single input. Accordingly, the wireless communication systems could include Wi-Fi, Bluetooth, GPS and the like and that use would be within the spirit and scope of the present invention. Accordingly, many modifications may be made by one of ordinary skill in the art without departing from the spirit and scope of the appended claims.

What is claimed is:

1. A front end receiver comprising:
   a plurality of transmissive signal paths originating from one signal input,
   a plurality of switching mechanisms;

at least one path of the plurality of transmissive signal paths including a first amplifier coupled to a first input port of each of the plurality of switching mechanisms;

at least another path of the plurality of transmissive signal paths including a second amplifier coupled to a second input port of each of the plurality of switching mechanisms, and a plurality of receiving subsystems each of the receiving subsystems coupled to the output port of each of the plurality of switching mechanisms, wherein each of the receiving subsystems controls the switching mechanism to select the path that is optimal for radio reception depending on the strength of the signal being received from the signal input.

2. The front end receiver of claim 1 wherein the first amplifier is a higher gain than the second amplifier.

3. The front end receiver of claim 1, wherein the first amplifier comprises a high gain amplifier and the second amplifier comprises an attenuator.

4. The front end receiver of claim 1, wherein the second amplifier has a high input impedance, and therefore, absorbs negligible amount of the signal energy when coupled with the first amplifier.

5. The front end receiver of claim 1, wherein both amplifiers are identical or similar, but there is an attenuator in between the signal input of the second amplifier to reduce the gain of the second amplifier and increase the high signal tolerance of the second amplifier.

6. The front end receiver of claim 1, wherein the gain of one or more of the amplifiers may be adjustable.

7. The front end receiver of claim 1, wherein each of the switching mechanisms comprises:

a pair of amplifiers; the input of one of the pair of amplifiers is coupled to the output of the first amplifier and the input of the other of the pair of amplifiers is coupled to output of the second amplifier; the outputs of the switching mechanism amplifiers are coupled together; and an enable mechanism configured to turn on one of the pair of amplifiers thereby selecting a transmission path to a receiving subsystem based upon strength of the signal received from the signal input.

8. The front end receiver of claim 1, wherein the plurality of transmissive signal paths comprises two transmissive signal paths.

9. The front end receiver of claim 4, wherein the two receiving subsystems comprise a first receiving subsystem for Bluetooth application and a second receiving subsystem for wireless LAN application.

10. A radio receiver comprising:

a front end receiver, the front end receiver comprising;

a plurality of transmissive signal paths originating from one signal input, a plurality of switching mechanisms;

at least one path of the plurality of transmissive signal paths including a first amplifier coupled to a first input port of each of the plurality of switching mechanisms;

at least another path of the plurality of transmissive signal paths including a second amplifier coupled to a second input port of each of the plurality of switching mechanisms, and a plurality of receiving subsystems each of the receiving subsystems coupled to the output port of each of the plurality of switching mechanisms, wherein each of the receiving subsystems controls the switching mechanism to select the path that is optimal for radio reception depending on the strength of the signal being received from the signal input; and an antenna coupled to the input of the front end receiver; wherein the outputs of the receiving subsystems are coupled to at least one demodulator to convert a modulated signal to baseband waveforms which can be either analog or digital.

11. The front end receiver of claim 10 wherein the first amplifier is a higher gain than the second amplifier.

12. The front end receiver of claim 10, wherein the first amplifier comprises a high gain amplifier and the second amplifier comprises an attenuator.

13. The front end receiver of claim 10, wherein the second amplifier has a high input impedance, and therefore, absorbs negligible amount of the signal energy when coupled with the first amplifier.

14. The front end receiver of claim 10, wherein both amplifiers are identical or similar, but there is an attenuator in between the signal input of the second amplifier to reduce the gain of the second amplifier and increase the high signal tolerance of the second amplifier.

15. The front end receiver of claim 10, wherein the gain of one or more of the amplifiers may be adjustable.

16. The front end receiver of claim 10 wherein each of the switching mechanisms comprises:

a pair of amplifiers; the input of one of the pair of amplifiers is coupled to the output of the first amplifier and the input of the other of the pair of amplifiers is coupled to output of the second amplifier; the outputs of the switching mechanism amplifiers are coupled together; and an enable mechanism configured to turn on one of the pair of amplifiers thereby selecting a transmission path to a receiving subsystem based upon strength of the signal received from the signal input.

17. The front end receiver of claim 10, wherein the plurality of transmissive signal paths comprises two transmissive signal paths.

18. The front end receiver of claim 10, wherein the two receiving subsystems comprise a first receiving subsystem for Bluetooth applications and a second receiving subsystem for wireless LAN applications.

19. The front end receiver of claim 10, wherein the antenna is directly coupled to the input of the front end receiver.

20. The front end receiver of claim 10, wherein the antenna is coupled to the front end receiver via additional switches.

21. The front end receiver of claim 10, wherein the antenna is coupled to the front end receiver via a filter network.

* * * * *